(12) United States Patent
Moon

(10) Patent No.: US 6,710,411 B2
(45) Date of Patent: Mar. 23, 2004

(54) METHOD FOR CRYSTALLIZING SILICON FILM AND THIN FILM TRANSISTOR AND FABRICATING METHOD USING THE SAME

(75) Inventor: Dae-Gyu Moon, Anyang-shi (KR)

(73) Assignee: LG.Philips LCD Co., Ltd., Seoul (KR)

( * ) Notice: Subject to any disclaimer, the term of this patent is extended or adjusted under 35 U.S.C. 154(b) by 92 days.

(21) Appl. No.: 10/059,305

(22) Filed: Jan. 31, 2002

(65) Prior Publication Data

US 2002/0090766 A1 Jul. 11, 2002

Related U.S. Application Data

(63) Continuation of application No. 09/401,924, filed on Sep. 23, 1999, now Pat. No. 6,558,989.

(30) Foreign Application Priority Data

Sep. 28, 1998 (KR) ......................................... 1998-40213

(51) Int. Cl.[7] ........................ H01L 27/01; H01L 27/12
(52) U.S. Cl. ............................... 257/349; 257/E29.295
(58) Field of Search .................. 257/E29.295, 349, 257/E29.117, E29.133

(56) References Cited

U.S. PATENT DOCUMENTS

| | | | | |
|---|---|---|---|---|
| 4,319,954 A | * | 3/1982 | White et al. ................. 438/663 |
| 5,105,246 A | * | 4/1992 | Da Costa .................... 257/347 |
| 5,471,330 A | * | 11/1995 | Sarma ......................... 349/43 |
| 5,864,160 A | * | 1/1999 | Buynoski .................... 257/339 |
| 5,950,077 A | * | 9/1999 | Ohue et al. ................. 438/149 |
| 6,071,762 A | * | 6/2000 | Wu et al. .................... 438/151 |
| 6,093,586 A | * | 7/2000 | Gosain et al. .............. 438/162 |
| 6,127,251 A | * | 10/2000 | Gardener et al. ........... 438/585 |
| 6,140,158 A | * | 10/2000 | Rhee et al. ................. 438/149 |
| 6,218,318 B1 | * | 4/2001 | Ohkura et al. ............. 438/782 |

OTHER PUBLICATIONS

Do–Hyun Choi, et al., Drastic Enlargement of Grain Size of Excimer–Laser–Crystallized Polysilicon Films, Jpn. J. Appl. Phys., vol. 31(1992), pp. 4545–4549, Part 1, No. 12B, Dec. 1992.*

* cited by examiner

Primary Examiner—W. David Coleman
(74) Attorney, Agent, or Firm—McKenna Long & Aldridge LLP

(57) ABSTRACT

A method for crystallizing an amorphous silicon film which includes the steps of: preparing a substrate having the amorphous silicon film, the amorphous silicon film being formed on an intermediate layer in which an inner space exists; applying an energy to the amorphous silicon film in order to crystallize the amorphous silicon film, wherein the step of preparing the substrate includes the steps of: forming a material layer for forming the space on an insulating substrate, forming the intermediate layer to cover the material layer, forming the amorphous silicon film on the intermediate layer, selectively removing the amorphous silicon film and the intermediate layer to expose a part of the material layer for forming space, and removing the material layer for forming space; or forming a material layer for forming the space on an insulating substrate, forming the intermediate layer to cover the material layer, selectively removing the intermediate layer to expose a part of the material layer, removing the material layer, and forming the amorphous silicon film on the intermediate layer.

8 Claims, 7 Drawing Sheets

METHOD FOR CRYSTALLIZING SILICON FILM AND THIN FILM TRANSISTOR AND FABRICATING METHOD USING THE SAME

CROSS REFERENCE TO RELATED ART

This is a division of Application Ser. No. 09/401,924, filed Sep. 23, 1999, now U.S. Pat. No. 6,558,989.

This application claims the benefit of Korean Patent Application No. 1998-40213, filed on Sep. 28, 1998, which is hereby incorporated by reference.

BACKGROUND OF THE INVENTION

1. Field of the Invention

The present invention relates to a method for crystallizing a silicon film and a thin film transistor and fabricating method using the same and, more particularly, to a method for crystallizing a silicon film and a method for fabricating a thin film transistor using a laser annealing technique.

2. Discussion of the Related Art

When certain energy, such as laser energy, is applied to amorphous silicon, the amorphous silicon melts and as it cools or solidifies, silicon grains grow and crystallize. Polycrystalline silicon or single crystalline silicon is determined depending on the state of growth of the silicon grain. Single crystalline silicon is obtained in case each silicon grain grows in a single direction and polycrystalline silicon is obtained in case each silicon grain grows randomly at the same time.

For a thin film transistor whose active layer is formed by crystallizing an amorphous silicon film in order to enhance the characteristics of the thin film transistor, it is preferable to reduce the number of grain boundary, which inhibits migration of carriers, by increasing the size of the silicon grain.

FIGS. 1A to 1D are schematic diagrams for explaining a method for crystallizing an amorphous silicon film according to related art. Referring to FIG. 1A, a first insulation film 11 and an amorphous silicon film 12 are successively deposited on an insulating substrate 10. An oxide film which exhibits half-reflection is deposited on the amorphous silicon film 12 and then etched by lithography to form a half-reflection layer 13. Because the half-reflection layer 13 half-reflects an incident laser on the amorphous silicon film 12, the portion of the amorphous silicon film 12 which underlies the half-reflection layer 13 gets hot fast but cools slowly. Hereinafter, the portion of the amorphous silicon film 12 with the overlying half-reflection layer 13 is called a first silicon region 12-1 and the other portion of the amorphous silicon film 12 without the overlying half-reflection layer 13 is called a second silicon region 12-2.

Referring to FIG. 1B, a laser beam is irradiated to the entire surface of the substrate 10. Here, the energy of the laser beam is controlled to such a level that the first silicon region 12-1 is completely melted but the second silicon region 12-2 contains a predetermined number of unmelted silicon particles 14.

Referring to FIG. 1C, the irradiated amorphous silicon by laser beam is immediately cooled to have the silicon particles grow, thereby, to perform silicon crystallization.

During the crystallization, the silicon particles 14 remaining in the first silicon region 12-1 serve as seeds for growing the silicon grains and are grown. The silicon grains stop growing as they collide with one another. Crystallization occurs at many locations of the silicon film at the same time according to the locations of the growth seeds, so that the second silicon region 12-2 becomes a first polycrystalline silicon film 15 in which the silicon grains are randomly positioned. In contrast, the first silicon region 12-1 remains in a molten state due to the half-reflection layer 13 that retards cooling of the first silicon region 12-1.

Referring to FIG. 1D, an interface between the solid first polycrystalline silicon film 15 and the liquid first silicon region 12-1 becomes a crystal seed that provides a lateral growth of the grains developing from the boundary of the first polycrystalline silicon film 25. As a result, a silicon grain boundary is laterally positioned. Here, the silicon grains grown on both boundary sides meet together and stop growing at the center of the first silicon region 12-1. Thus, the first silicon region becomes a second polycrystalline silicon film 16 in which the grains are much larger in size than those of the first polycrystalline silicon film 15.

However, the silicon grains of the second polycrystalline silicon film 16 obtained in the related art have a size not exceeding a maximum of 1 $\mu$m under the processing atmosphere, at a room temperature or less than 400° C.

When the second polycrystalline silicon film having silicon grains larger than 1 $\mu$m in size is formed, as shown in FIG. 2, fine silicon grains are formed at many positions at the center of the second silicon region. Correspondingly, the polycrystalline silicon film crystallized by the related art technique is hard to use for an active layer of thin film transistor, considering that ordinary thin film transistor has a channel length of about 10 $\mu$m.

SUMMARY OF THE INVENTION

Accordingly, it is an object of the present invention to provide a silicon film crystallization method and a method for fabricating a thin film transistor using the same.

It is another object of the present invention to provide a silicon film crystallization method by which silicon grains can be dramatically increased in size.

Further, it is another object of the present invention to provide a method for fabricating a thin film transistor with an enhanced characteristic of the device, in which a silicon with silicon grains dramatically increased in size is used as an active layer of the thin film transistor.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the first object of the present invention, there is provided a method for crystallizing an amorphous silicon film including the steps of: preparing a substrate having the amorphous silicon film, the amorphous silicon film being formed on an intermediate layer which defines an inner space between the substrate and the intermediate layer; and applying an energy to the amorphous silicon film in order to crystallize the amorphous silicon film. The step of preparing the substrate includes the steps of: forming a material layer for forming the space on an insulating substrate, forming the intermediate layer to cover the material layer, forming the amorphous silicon film on the intermediate layer, selectively removing the amorphous silicon film and the intermediate layer to expose a part of the material layer for forming space, and removing the material layer for forming space; or forming a material layer for forming the space on an insulating substrate, forming the intermediate layer to cover the material layer, selectively removing the intermediate layer to expose a part of the material layer, removing the material layer, and forming the amorphous silicon film on the intermediate layer.

In another aspect of the present invention, there is provided a method for fabricating a thin film transistor including the steps of: preparing a substrate having the amorphous silicon film formed on an intermediate layer provided with an inner space at a predefined position thereof; applying a laser energy to the amorphous silicon film to crystallize the amorphous silicon film and form a polycrystalline silicon film; photo-etching the polycrystalline silicon film to form an active layer; forming a gate insulation film and a gate electrode on the active layer; forming a passivation layer covering the exposed entire surface of the substrate including the gate electrode; photo-etching the passivation layer to expose a part of the active layer; and forming source and drain electrodes connected to the exposed active layer.

In another aspect of the present invention, there is provided a thin film transistor including: an insulating substrate; an intermediate layer formed on the insulating substrate and having an inner space at a predefined position thereof; an active layer formed on the intermediate layer over the space; a gate insulation film and a gate electrode formed on the active layer; and source and drain electrodes connected to the active layer.

In another aspect of the present invention, a method of crystallizing an amorphous silicon layer comprises: forming an intermediate layer on a transparent substrate; forming an amorphous silicon layer on the intermediate layer; forming a space within the intermediate layer; and applying energy to the amorphous silicon layer for crystallizing the amorphous silicon layer.

In a further aspect of the present invention, a method of crystallizing an amorphous silicon layer comprises forming a material having a first heat conductivity on a transparent substrate; forming an intermediate layer having a second heat conductivity on the material and the transparent substrate, the first heat conductivity being less than the second heat conductivity; forming an amorphous silicon layer on the intermediate layer; applying energy to the amorphous silicon layer for crystallizing the amorphous silicon layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENTS

Hereinafter, the present invention will be described in detail with reference to the accompanying drawings.

FIGS. 3A to 3E are diagrams illustrating a method for crystallizing an amorphous silicon film according to a preferred embodiment of the present invention. In the preferred embodiment of the present invention, an inner space with a low heat conductivity is formed under a silicon portion to be used as an active region later, to suppress heat conductivity in the silicon portion over the inner space, thereby increasing the size of silicon grain of the silicon portion.

Figure 1A:
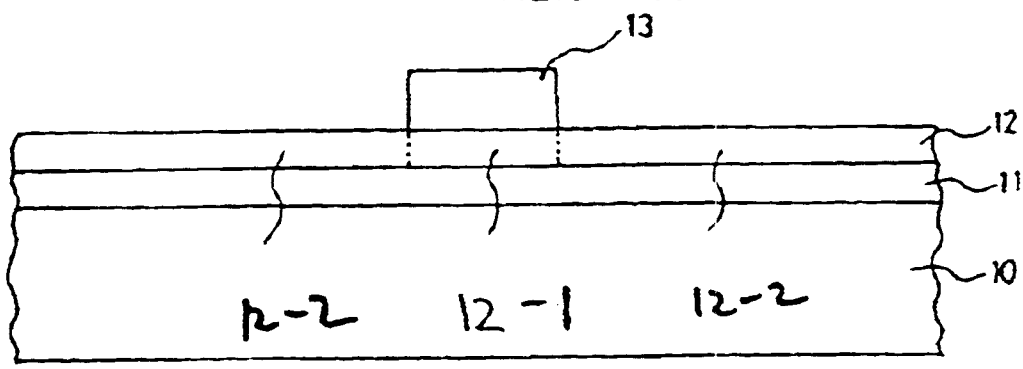
FIGS. 1A to 1D are diagrams illustrating a method for crystallizing an amorphous silicon film according to a related art.
Figure 1B:
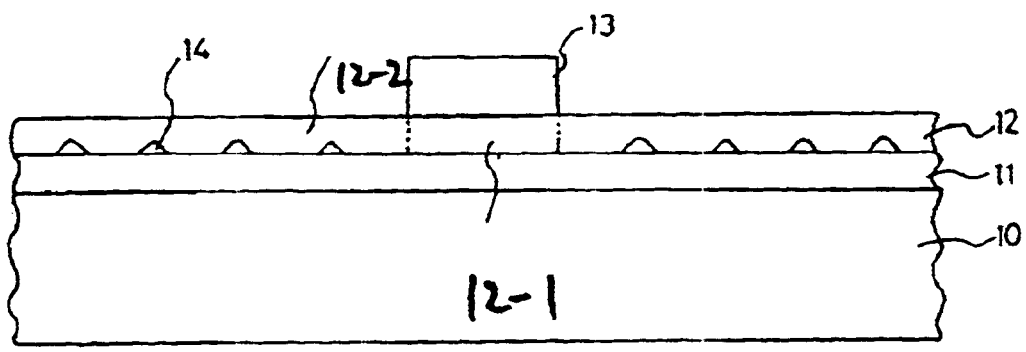
Figure 1C:
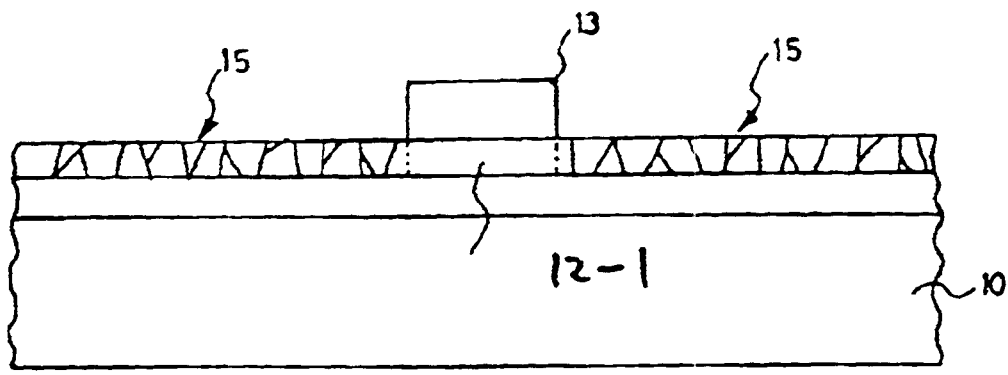
Figure 1D:
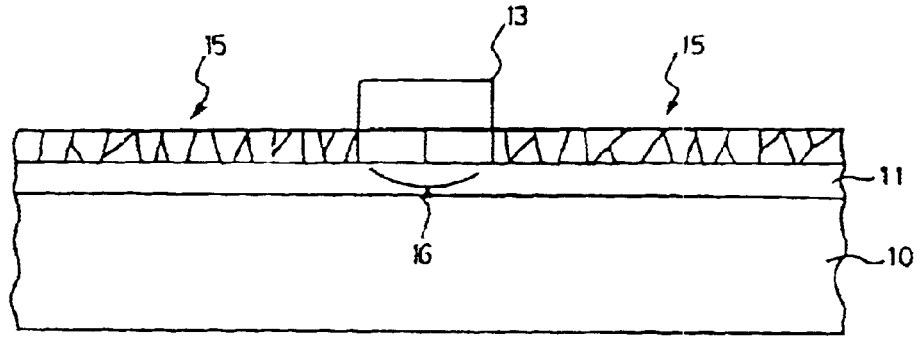
Figure 2:
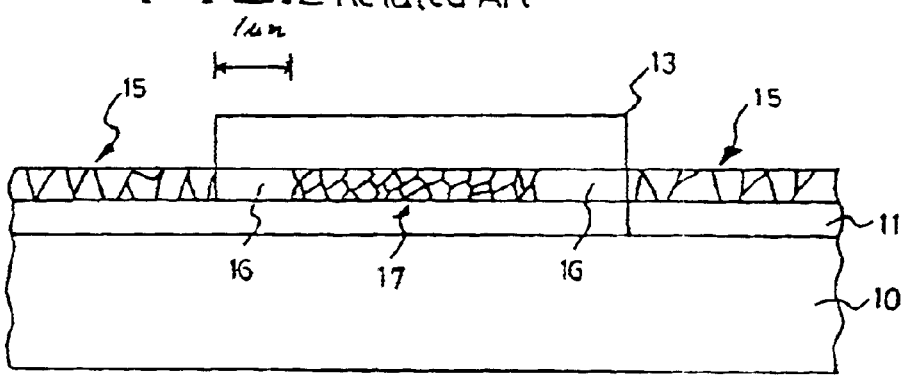
FIG. 2 is a diagram showing the state of silicon grains of the silicon film crystallized according to the related art.
Figure 3A:
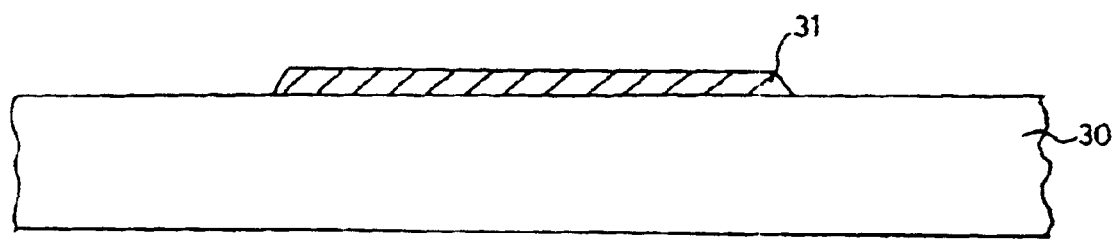
FIGS. 3A to 3E are diagrams illustrating a method for crystallizing an amorphous silicon film according to an embodiment of the present invention.

Referring to FIG. 3A, a first conductive layer is deposited on an insulating substrate 30 and then etched by lithography to form a material layer for forming a space 31. Here, the first conductive layer may be formed of metal, such as chrome or molybdenum, known to one of ordinary skill in the art.

Figure 3B:
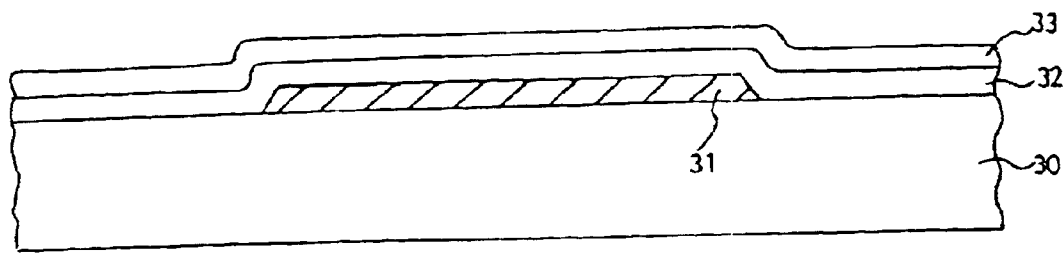

Referring to FIG. 3B, a first insulation film 32 covering the material layer for forming the space 31, and an amorphous silicon film 33 are sequentially formed. Then, an etch stop layer (not shown) is formed to selectively expose a portion of the amorphous silicon film 33 overlying the material layer for forming the space 31. Using an etch stop layer as a mask, the underlying amorphous silicon film 33 and the first insulation film 32 are etched to expose a certain part (not shown) of or all of the material layer for forming space 31.

Figure 3C:
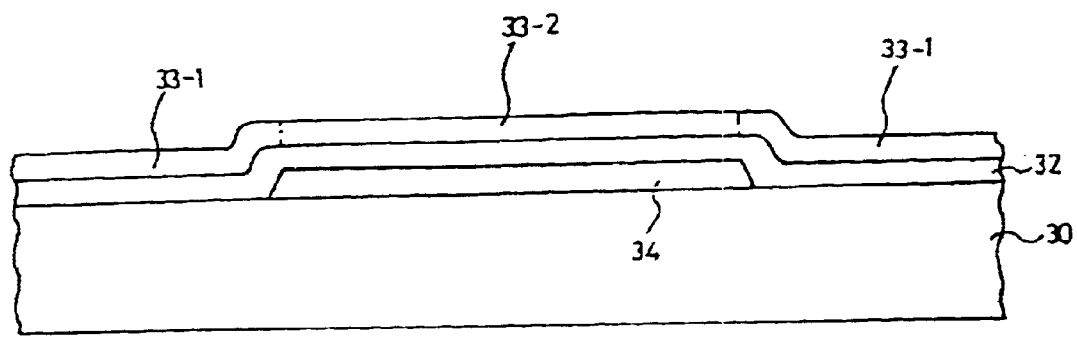

Referring to FIG. 3C, the material layer for forming the space 31 is removed by a wet or dry etching method using an etchant for selectively etching the material layer for forming the space 31. As a result, an inner space 34 being in the same condition as the atmosphere inside a process chamber is formed at a portion that is empty after the removal of the material layer that formed the space 31. Here, the etchant for removing the material layer for forming the space 31 has to preferably exhibit a high etching selectivity with respect to the first insulation film 32, in order to form the inner space 34 in accordance with the shape of the material layer for forming space 31 without damaging the first insulation film 32.

Hereinafter, the amorphous silicon film portion in the vicinity of the space 34 is called a second silicon region 33-2 and the other portion of the amorphous silicon film is called a first silicon region 33-1.

Figure 3D:
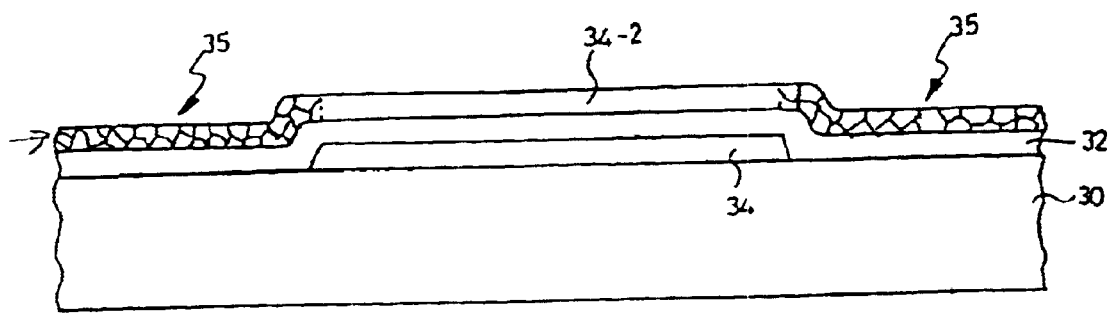

Referring to FIG. 3D, a laser beam is applied to the entire surface of the substrate 30. The laser energy density must be controlled to such a level in order to melt the entire amorphous silicon film completely. The melted silicon by being irradiated through the laser beam is rapidly cooled and crystallized.

In this process, the first silicon region 33-1 is first cooled and crystallized. The reason why the first silicon region 33-1 is cooled earlier than the second silicon region 33-2 is that the space 34 with a low heat conductivity relative to the other portions is positioned in the vicinity of the second silicon region 33-2. The space 34 has the same gaseous condition as the atmosphere inside the chamber and thus exhibits less heat conductivity than the first insulation film 32 which is formed of an insulating material. The laser energy, absorbed by the second silicon region 33-2, passes through the first insulation film 32 and the space 34, having a lower heat conductivity than that of the first insulation film 32, into the insulating substrate 30 and then dissipated. Accordingly, the second silicon region 33-2 is cooled in a retard fashion relative to the first silicon region 33-1. Alternatively, the space may be replaced by any suitable material that has less heat conductivity than the first insulation film.

Since the first silicon region 33-1 is rapidly cooled in a complete liquid state, a number of crystal seeds are created at many positions at the same time and grown into a first polycrystalline silicon film 35 composed of minute polycrystalline silicon grains. The second silicon region 33-2 which is cooled slowly remains in the liquid state.

Figure 3E:
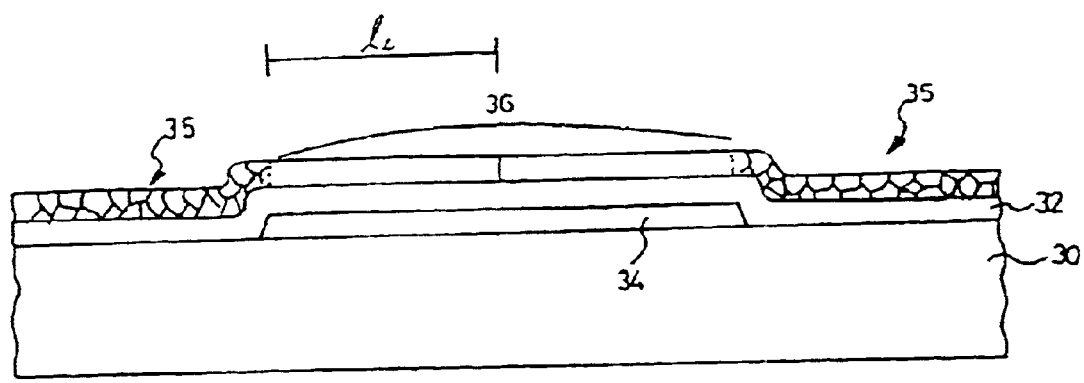

Referring to FIG. 3E, an interface between the liquid, first polycrystalline silicon film 35 and the solid, second silicon region 33-2 becomes a crystal seed that provides a lateral growth of the grains developing from the boundary of the first polycrystalline silicon film 35. As a result, a silicon grain boundary is laterally positioned. Here, the silicon grains grown on both boundary sides meet together and stop growing at the center of the second silicon region. Thus the second silicon region becomes a second polycrystalline silicon film 36 of which the grains are much larger in size than those of the first polycrystalline silicon film 15. In the figure, reference symbol l2 denotes the length of the silicon grains of the second polycrystalline silicon film 36.

The silicon grains of the second polycrystalline silicon film 36 are grown to a predetermined size depending upon the heat conductivity of space 34. The silicon grains can be grown to a size of more than several micrometers or several hundred micrometers under the processing conditions at room temperature or less than 400° C., although the growth of the silicon grains depends upon such factors as the thickness of the silicon film, the thickness of the space and the intensity of the laser energy. Therefore, it is possible to determine an appropriate width of space 34 so as to form the second polycrystalline silicon film 36 in which two silicon grains are opposite each other after the crystallization.

The second polycrystalline silicon film 36 crystallized according to the first embodiment of the present invention has silicon grain boundaries of a small number and can be applied to the channel region of an active layer of the thin film transistor to enhance the characteristic of the device.

Figure 4:
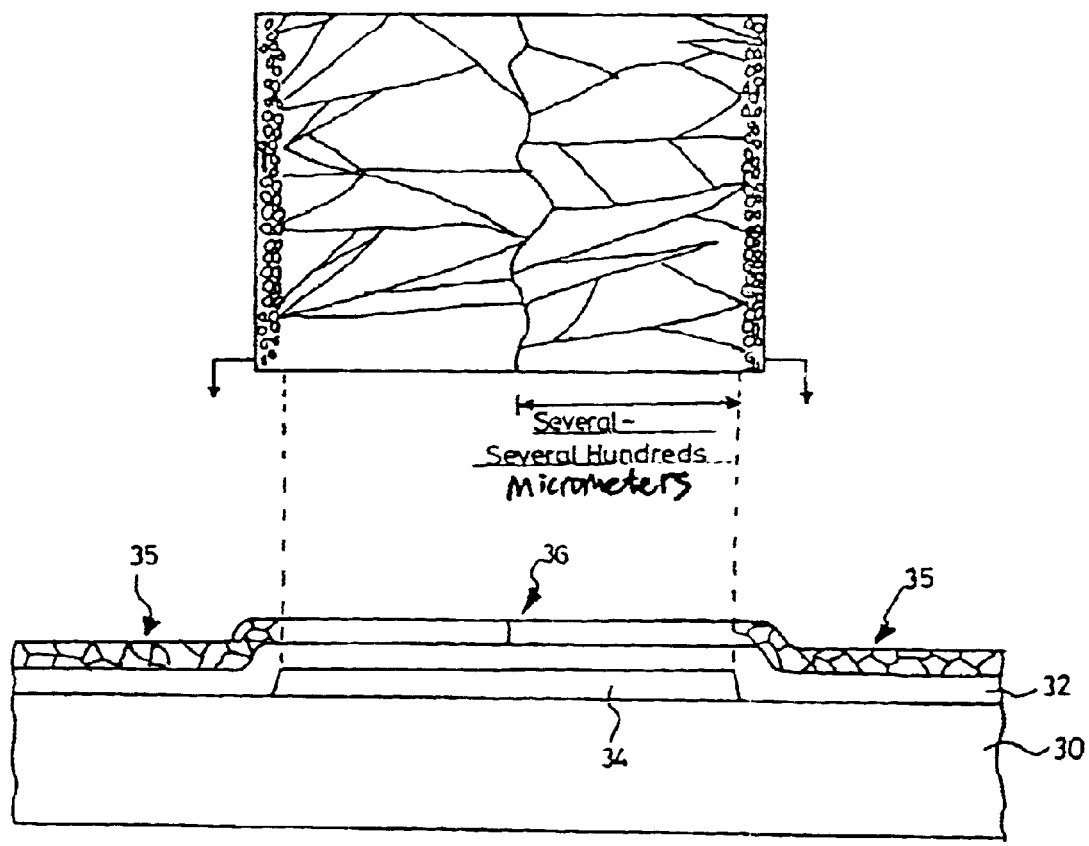
FIG. 4 is a plan view showing the state of silicon grains of the silicon film crystallized according to the embodiment of the present invention.

FIG. 4 is a plan view showing a resultant silicon film crystallized according to the first embodiment of the present invention. As shown in the figure, silicon grains of fairly large size, e.g., more than 5 µm, are grown in the second polycrystalline silicon film 36 in the vicinity of the space 34. The silicon grains of the second polycrystalline silicon film 36 are formed from lateral crystal seeds, minute silicon grains existing on the boundary with the first polycrystalline silicon film 35, and laterally grown during the crystallization.

Although the first insulation film 32 is used as the intermediate layer in the first embodiment, the intermediate layer may be any material that forms an inner space according to the first embodiment.

The material layer for forming a space 31 is formed of an ordinary metal material in the first embodiment and may be formed of any material other than that of the intermediate layer.

For example, if the insulation film is used as the intermediate layer as described in connection with the first embodiment, the material layer for forming the space 31 may be a transparent conductive layer, such as ITO, a semiconductor layer, or an ordinary insulation film.

In the first embodiment, after the insulation film 32 is formed as the intermediate layer covering the material layer for forming the space 31, the amorphous silicon film 33 is formed on the insulation film 32 and the material layer for forming the space 31 is removed. However, the process may be performed in a different order. After the insulation film 32 is formed as the intermediate layer covering the material layer for forming space 31, the material layer for forming space 31 is removed to form the space 34 inside the insulation film 32.

Although a laser is used to crystallize the amorphous silicon film in the first embodiment, any kind of energy can be applied to the amorphous silicon film as long as it crystallizes the amorphous silicon film.

Figure 5A:
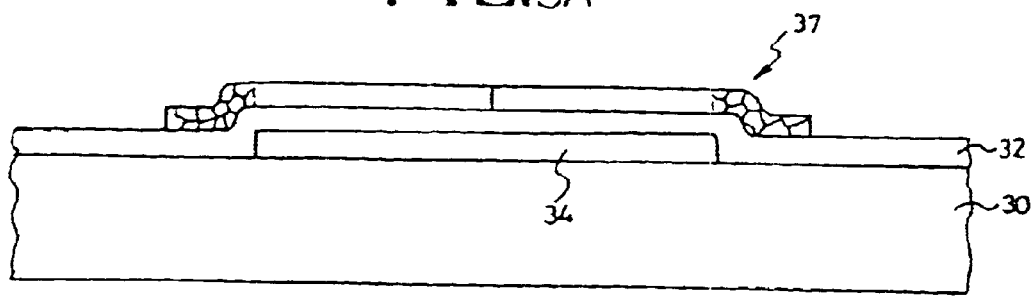
FIGS. 5A to 5C are diagrams illustrating a method for fabricating a thin film transistor according to the present invention.
Figure 5B:
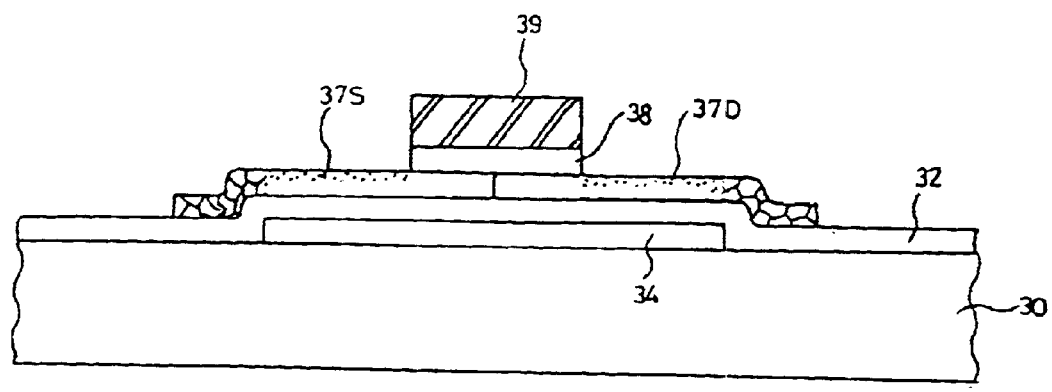
Figure 5C:
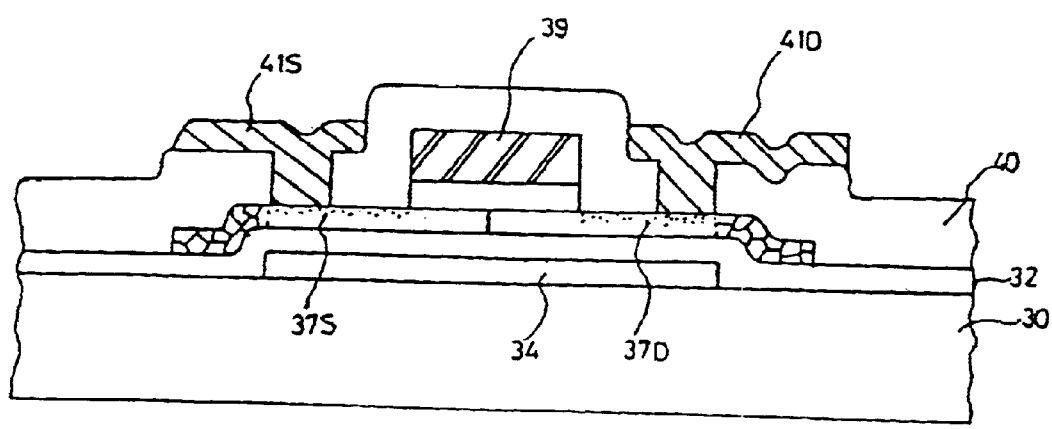

FIGS. 5A to 5C are diagrams illustrating a method for fabricating a thin film transistor according to the present invention. Referring to FIG. 5A, the polycrystalline silicon film crystallized according to the preferred embodiment is etched by lithography to form an active layer 37. Here, the second polycrystalline silicon film in which silicon grains are grown to a large size of several micrometers or several hundred micrometers, for example, more than 5 µm is used for a channel region of the active layer 37. Positioning space 34 is very important at the early stage of the manufacturing process, in which case the space 34 is formed at a position that will become the channel region, the active region of the thin film transistor.

Referring to FIG. 5B, an insulation film and a conductive layer are sequentially deposited on the active layer 37. The conductive layer is etched by lithography to form a gate electrode 39 and the insulation film is selectively etched to form a gate insulation film 38. Then, conductive impurities are implanted in the entire surface of the substrate to form a source region 37S and a drain region 37D in the active layer 37.

Referring to FIG. 5C, a passivation layer 40 is formed on the entire surface of the substrate and then selectively etched to expose a part of the source and drain regions 37S and 37D. Subsequently, a conductive layer is deposited on the entire surface of the exposed substrate and then etched by lithography to form a source electrode 41S and a drain electrode 41D.

Figure 6:
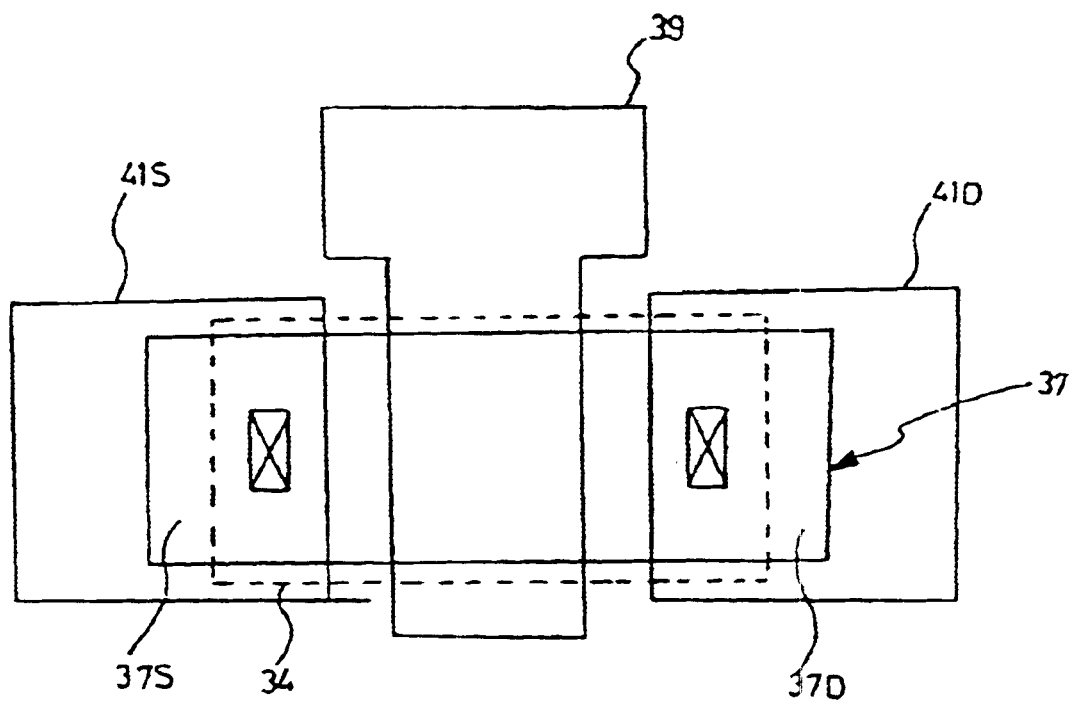
FIG. 6 is a schematic plan view of the thin film transistor fabricated according to the present invention.

FIG. 6 is a schematic plan view of the thin film transistor fabricated according to the present invention.

The space 34 is positioned in the vicinity of the channel region of the active layer 37 so that silicon grains are grown to a fairly large size in the channel region. Space 34 is more than 10 µm in width, since the silicon grains are grown to a size of several micrometers or several hundred micrometers at a room temperature or a low temperature of less than 400° C. Compared with ordinary thin film transistor whose channel region is about 10 µm long, the present invention thin film transistor has enhanced reliability of the device due to the dramatically reduced number of silicon grain boundaries.

Although the space 34 is positioned in the vicinity of the channel region of the active layer 34 in the second embodiment, it is possible to control the size of the silicon grains to several to several hundreds µm according to the intensity of the laser energy, the thickness of the silicon film, the processing temperature of a chamber, and the like such that space 34 has an increased width that overlaps with the most part of the active layer 37.

As described above, the present invention provides a polycrystalline silicon film composed of silicon grains whose size is extremely large. In addition, the channel region of the active layer is formed of the polycrystalline silicon film so as to enhance reliability of the device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor comprising:
   an insulating substrate;
   an intermediate layer formed on the insulating substrate and having an inner space at a predefined position thereof;
   an active layer formed on the intermediate layer over the space;
   a gate insulation film and a gate electrode formed on the active layer; and
   source and drain electrodes connected to the active layer.

2. The thin film transistor of claim 1, further comprising:
   a source region formed in the active layer and connected to the source electrode; and
   a drain region formed in the active layer and connected to the drain electrode.

3. The thin film transistor of claim 1, wherein the intermediate layer is an insulation film.

4. The thin film transistor of claim 1, wherein the inner space includes one of an indium tin oxide layer, a semiconductor layer, and an insulating layer.

5. A thin film transistor, comprising:
   an inner space formed on an insulating substrate;
   an insulation film formed on an entire surface of the inner space;
   an amorphous silicon layer over the insulation film, wherein the amorphous silicon layer has a first region and a second region, the second region being crystallized and forming an active layer;
   a gate insulation film and a gate electrode on the active layer; and
   source and drain electrodes connected to the active layer.

6. The thin film transistor of claim 5, further comprising:
   a source region formed in the active layer and connected to the source electrode; and
   a drain region formed in the active layer and connected to the drain electrode.

7. The thin film transistor of claim 5, wherein the intermediate layer is an insulation film.

8. The thin film transistor of claim 5, wherein the inner space includes one of an indium tin oxide layer, a semiconductor layer, and an insulating layer.

* * * * *